United States Patent [19]

Lohmann et al.

[11] 4,099,129
[45] Jul. 4, 1978

[54] CONTROL PULSE GENERATOR FOR THE CYCLICAL FAULT-FREE GENERATION OF AN ACCURATE SEQUENCE OF CONTROL PULSES

[75] Inventors: Heinz-Juergen Lohmann, Brunswick; Gerd Kopperschmidt, Cremlingen, both of Germany

[73] Assignee: Siemens Aktiengesellschaft, Berlin & Munich, Germany

[21] Appl. No.: 746,620

[22] Filed: Dec. 1, 1976

[30] Foreign Application Priority Data

Jan. 21, 1976 [DE] Fed. Rep. of Germany ....... 2602169

[51] Int. Cl.² .................. H03K 17/26; H03K 3/64
[52] U.S. Cl. .................................... 328/75; 328/55; 328/130; 328/207
[58] Field of Search ............... 328/43, 55, 63, 75, 328/130, 207

[56] References Cited

U.S. PATENT DOCUMENTS

| 2,984,789 | 5/1961 | O'Brien | 328/43 X |
| 3,051,855 | 8/1962 | Lee | 328/43 X |
| 3,109,990 | 11/1963 | Shuba | 328/43 |
| 3,115,608 | 12/1963 | Guillon | 328/130 X |
| 3,248,657 | 4/1966 | Turecki | 328/130 X |
| 3,311,757 | 3/1967 | Matsumoto | 328/130 X |

Primary Examiner—John S. Heyman
Attorney, Agent, or Firm—Hill, Gross, Simpson, Van Santen, Steadman, Chiara & Simpson

[57] ABSTRACT

A control pulse generator for the cyclical fault-free generation of an accurate sequence of control pulses utilizing a quartz pulse generator which is operatively connected to and adapted to initiate actuation of a plurality of serially connected to delay members over a control circuit which is operative, at the termination of a cycle of actuation of the serially connected delay members, to limit the initiation of a succeeding cycle by a pulse from the generator to a predetermined period of time following termination of the first cycle of operation and functioning as a self-holding circuit when the period duration of the quartz generator signals coincide with the running time of the serially connected delay members. Further means are provided for checking the duration of the limiting period to insure proper operation.

4 Claims, 2 Drawing Figures

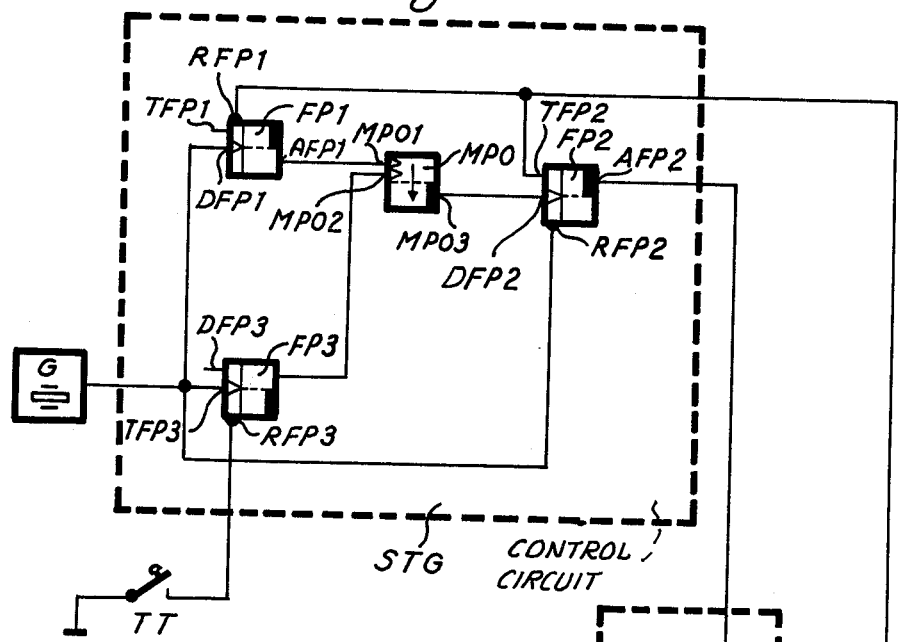
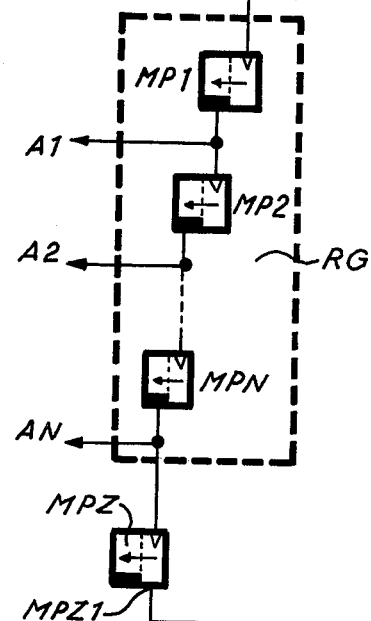
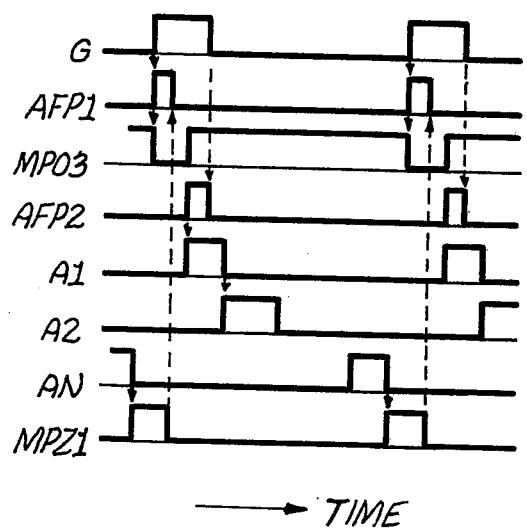

CONTROL PULSE GENERATOR FOR THE CYCLICAL FAULT-FREE GENERATION OF AN ACCURATE SEQUENCE OF CONTROL PULSES

BACKGROUND OF THE INVENTION

The invention relates to a control pulse generator for the cyclical fault-free generation of an accurate sequence of control pulses, utilizing a quartz generator for initiating actuation of a plurality of serially connected delay members over a control circuit which, when temporal coincidence occurs of the period duration of the quartz generator signals with the running time of the serially connected delay members, forms what might be termed a "self-holding" circuit.

Generators of this type are required in the control of processing sequences in digitally functioning switching control mechanisms, and it is important that the control signals meet relatively rigid prescribed conditions with respect to their temporal duration and cyclical sequence. Modern pulse-current supplies for digital mechanisms of this type can, for example, be so constructed that a control pulse generator of the type mentioned generates a pulse program which forms a pacemaker for the entire system and thus synchronously controls a plurality of pulse generators. A pulse-current supply of this type for a two-channel circuit system is illustrated in U.S. Pat. No. 3,798,558. This safety circuit functions with anti-valent switching variables in the form of two rectangular signal voltages of identical sequence frequency and amplitude, but with a phase difference of 180° for differentiating the two values of the switching variables. In addition to the signal voltages referred to, a monitoring pulse of at least twice the sequence frequency is required, which pulse lies outside the edge range of the signal voltages. A phase control pulse necessary for control purposes, as well as an edge control pulse must have a rigid correlation to each other in order to insure a proper progress of all control operations.

As the control pulse generator, triggering the edge control pulse, the monitoring pulse and the phase control pulse is not constructed in accordance with special safety principles, but can comprise a simple frequency divider circuit, the accuracy of conditions with regard to temporal duration and sequence of the admitted pulses cannot be absolutely guaranteed.

BRIEF SUMMARY OF THE DESCRIPTION

The invention therefore has as its primary objective, the production of a control pulse generator of the general type above referred to, which does not require switching members which, signalwise, are fault-free. The objective is achieved in accordance with the present invention by the utilization of a control circuit utilizing a first pulse-edge controlled D-flipflop having a directly acting reset input which is connected to a delay member, disposed at the last point of the serially connected delay members, and is operative to effect a blocking of the D-flipflop other than during the running time of the delay member. The output of the D-flipflop is connected to a dynamic input of a monostable flipflop whose normal or basic condition output is connected to the pulse input of a second pulse-edge controlled D multivibrator. The D-input of the latter is likewise connected to the output of the delay member, while the directly acting blocking input thereof is connected to the quartz generator with the normal condition output of such multivibrator forming the output of the control circuit.

As all switching members of such control circuit are actuated in an advantageous manner in each cycle, independently of sequence, time deviations as well as switching failures, due to possible disturbances, are immediately noticeable as no further cycles will thereafter be triggered. As a result of the special construction of the circuit and the selected interdependencies, it is possible to produce a pulse generator that does not require gate circuits which, signalwise, are technically fault-free, whereby common commercially available component parts can be utilized. As the circuit utilizes self-holding principles, the control pulse generator is not automatically self-starting following a shut-down, but must be provided with suitable starting means, and in accordance with an advantageous further development of the invention, the control circuit is provided with a third pulse-edge controlled D-flipflop whose pulse input is connected to the quartz generator, and whose directly acting blocking input is selectively connectible to a reset potential, for example ground potential, by means of a push button contact for effecting a starting operation, with the output of such third D-flipflop being connected to a second dynamic input of the monostable multivibrator in the control circuit.

BRIEF DESCRIPTION OF THE DRAWING

In the drawing wherein like reference characters indicate like or corresponding parts:

FIG. 1 is a schematic circuit of a control pulse generator constructed in accordance with the present invention, FIG. 2 is a chart illustrating the phase relationships between different portions of the circuit of FIG. 1

DETAILED DESCRIPTION OF THE INVENTION

The control pulse generator illustrated in the drawing comprises a quartz generator G which controls, by means of a control circuit STG, a series arrangement RG comprising a plurality of serially connected delay members, for example monostable multivibrators MP1, MP2 to MPN. Also connected to the series arrangement RG is a special monostable multivibrator MPZ which has an especially short return time as compared with the other monostable multivibrators. Control signals for the processing sequence of a digitally functioning switching control mechanism are supplied at the respective outputs A1, A2 to AN of the series arrangement RG. The respective monostable multivibrators MP1–MPN of such arrangement are so interconnected that in each case a following multivibrator will be triggered upon the return of the preceding multivibrator to its stable condition. For example, upon return of the multivibrator MP1 from the instable condition into the basic condition, the next following multivibrator i.e., MP2 is triggered over its dynamic input into its unstable state and upon its return to the basic state, the following flipflop will be triggered. Consequently, by means of a selection of varying return times to the corresponding basic condition, the signals supplied at the outputs A1, A2 to AN can be readily determined as to their pulse width.

The series arrangement RG thus assures that at each point in time, only a single one of the monostable multivibrators is in its unstable state, and further the individual monostable multivibrators are triggered, one after another in a fixed sequence. As a result, the signals supplied at the outputs A1, A2 to AN are generated, without danger of overlap, in the desired sequence as determined by the multivibrators of the series arrangement. The total running time of the series arrangement RG, representing the sum of the running times of the respective unstable states of the individual monostable multivibrators MP1–MPN, is so selected that it coincides with the period duration of the quartz generator G, the pulses of which are utilized for triggering the first monostable multivibrator MP1 over the control circuit STG. If the entire circuit is error-free, the last monostable multivibrator MPN of the series arrangement RG must have just returned to its basic condition with a triggering of the subsequent monostable multivibrator MPZ. As previously mentioned, the unstable state of the latter has a short duration and such multivibrator must be in such unstable state if the next pulse of the quartz generator G is to trigger another cycle of operation. Consequently, if such triggering pulse from the quartz generator is not present during the unstable state such multivibrator operation will cease.

The control circuit STG provides a fault-free comparison of the duration of the quartz generator period with the total running time of the series arrangement RG, including that of the monostable multivibrator MPZ. Such monitoring is important as the time over which a monostable multivibrator remains in its instable condition is determined by the time constant of a resistance-capacitor member and by the threshold of the particular multivibrator. As a result of multivibrator drift failures and total failures of the time-determining component elements, the running time of a monostable multivibrator, i.e., the time in which the multivibrator is in its unstable state can be lengthened or shortened within wide limits. In addition, as a result of defects of component parts, it is possible for switching failures to occur, so that the output remains on a potential which lies between the two supply potentials of the circuit.

The control circuit STG comprises a first pulse-edge controlled D-flipflop FP1, the output AFP1 of which is operatively connected to the first delay member MP1, of the series arrangement RG, over a monostable multivibrator MPO and a second pulse-edge controlled D-FP2. Thus, the output AFP1 of the D-flipflop is connected to the dynamic input MPO1 of the monostable multivibrator MPO, with the normal or basic state ouput MPO3 thereof being connected to the pulse or triggering input TFP2 of the second D-flipflop FP2, the normal state output AFP2 of which forms the output of the control circuit STG and is connected to the dynamic input of the first delay member MP1 of the series arrangement RG.

The pulse or trigger input TFP1 of the first D-flipflop FP1 as well as the directly acting blocking input RFP2 of the second D-flipflop FP2 are connected to the generator G, while the directly acting reset input RFP1 of the first D-flipflop FP1 and the D-input DFP2 of the second D-multivibrator FP2 are connected to the output MPZ1 of the monostable flipflop MPZ. The D-input DFP1 of the first D-flipflop FP1 is not connected in the specific circuit and may be considered as having an input which is provided with logic 1.

As the circuit, thus far described, is of the "self-holding" type, it is not self-starting, and means are therefore provided for initiating the operation of the circuit. In the embodiment illustrated, such means comprises a third pulse-edge controlled D-flipflop FP3 which has its triggering input TGP3 connected to the generator G, and its output AFP3 connected to a second dynamic input MPO2 of the monostable multivibrator MPO. The D-input DFP3 of the third D-flipflop FP3, as has been mentioned with respect to the D-input DFP1 of the first D-flipflop, is not connected in the circuit and is operative as if such input were occupied with logic 1, while the directly acting reset input RFP3 of the D-flipflop FP3 is connected over a suitable push button contact TT to a suitable reset potential, illustrated in the circuit as being ground potential.

Operation

Assuming that the control pulse generator is already in operation, as long as the monostable multivibrator MPZ remains in its basic or normal state, a signal with the value of zero will be present at the output MPZ1 thereof, and thus at the directly acting reset input RFP1 of the D-flipflop FP1. Such flipflop thus is set into its normal position and is held therein. The signal transmitted from the monostable multivibrator MPZ is also present at the D-input DFP2 of the flipflop FP2, but as no pulse is present at the pulsing trigger input TFP2 no flipping takes place.

With this condition, the positive edge of the signal emitted by the quartz generator G, for example arriving too early, cannot actuate the flipflop FP1 from its normal position into its other position and thus in effect cannot pass therethrough, as such flipflop is being held in such normal position. Only when the last monostable multivibrator MPN of the series arrangement RG, following flipping of such multivibrator, returns to its normal or basic state, is the monostable multivibrator MPZ triggered, at which time a signal appears at its output MPZ1 with the value of 1, which condition exists during the running time of such multivibrator in its unstable state. If, during this period of time, the front edge of a signal emitted by the quartz generator G is present at the pulse input TFP1 of such multivibrator, the latter will be triggered from the normal position into its other state, thereby generating a positive output edge which is supplied to the dynamic input MPO1 of the monostable MPO.

As a result of this operation, a narrow "time window", as determined by the selected very short return time of the monostable multivibrator MPZ, is opened, with the latter thus supplying at its output MPZ1 an output signal having the value 1, which releases the D-flipflop FP1 for the brief time interval corresponding to such "time window". Consequently, if during this period of time the front edge of a signal supplied by the quartz generator G arrives at the trigger or pulse input TFP1 of the D-flipflop FP1, the latter is triggered from its normal state into its other state and generating in the operation a positive output edge, operative to trigger the monostable multivibrator MPO over the dynamic input MPO1 thereof.

If the positive edge of such an output signal emitted by the quartz generator G does not arrive until after the monostable multivibrator MPZ has returned to its normal or basic state, following the above referred to time window, the D-flipflop FP1 cannot be switched, over as the blocking exists at such time. As a result, the signal from the quartz generator G has no effect, and, in like manner, the monostable multivibrator MPO remains in its normal or basic state.

Thus, if signals emitted by the quartz generator G are not present during the time windows determined by the monostable multivibrator MPZ, i.e. the quartz-generator period-duration does not coincide with the running time of the series arrangment RG, the latter in connection with the control circuit STG does not function as a self-holding circuit and pulses will not be emitted at the outputs A1, A2-AN.

The precision in the comparison of the period duration of the quartz generator G with the total running time of the series arrangement RG is dependent upon the "time window", i.e. on the running time of the additional monostable multivibrator MPZ. The shorter the time duration thereof, the more precise the time comparison becomes and the sooner a divergence therebetween can be determined. Evey unnoticed increase in the running time of the monostable multivibrator MPZ thus simultaneously involves an unnoticed decrease in the precision of the operation.

The prompt return of the monostable multivibrator MPZ into its normal or basic state is therefore also checked. This is achieved by means of the D-flipflop FP2, the pulse or trigger input TFP2 of which is connected to the basic-state output MPO3 of the monostable multivibrator MPO. The D-flipflop FP2 if thus triggered from the normal state into its other state during each cycle and is prepared whenever a signal is emitted by the quartz generator G with the value of zero. Following the positive edge of the quartz generator signal, the D-flipflop FP2 is released and is triggered by the monostable multivibrator MPO when the latter returns to its basic state.

However, the D-flipflop FP2 can be set into the normal state only if the output signal of the monostable multivibrator MPZ has the value of zero at such point in time, i.e. if the monostable multivibrator MPZ has already returned to its basic state. The positive edge pulse required for the triggering of the first monostable multivibrator MP1 of the series arrangement RG thus occurs only when the D-flipflop FP2 is triggered back into the normal position. In the following period of time, the individual monostable multivibrators of the series arrangement RG are switched, one after another, until finally the monostable multivibrator MPZ is actuated to supply another "time window".

The circuit may be placed into operation by closing the push button contact TT, which thus connects the directly acting reset input RFT3 of the D-flipflop FP3 to a reset potential, i.e. ground, whereby such D-flipflop is set in its normal state and held there for the time duration of the push button actuation. The first positive pulse-edge arriving from the quartz generator G, following the opening of the push button contact TT, thus triggers the D-flipflop FP3 from the normal state into the other position. As a result, the positive output pulse edge of such D-flipflop, thereby generated, triggers the monostable multivibrator MPO over the dynamic imput MPO2 thereof.

Thus, the output signal from the D-flipflop FP3 is substituted for an output signal from the D-flipflop FP1 which cannot then be supplied as a result of the blocking thereof. The D-flipflop FP3 thereafter remains in the state it has assumed which, however, has no influence with respect to a further switching sequence. Subsequently, if the circuit is functioning in a proper manner, the monostable multivibrator MPO will be triggered only by D-flipflop FP1 since, in accordance with the prerequisites, the flipflop FP3 cannot return to the normal position without the push button being again operated, and thus cannot generate a further positive edge for actuation of the monostable multivibrator MPO.

It will be appreciated from the above that during the normal or proper operation of the circuit, flipflops FP1 and FP2 are alternately switched while simultaneously therewith the running time of the monostable multivibrator MPO in its unstable state is also monitored within the framework of the total running time of the series arrangement RG. Consequently an accurate check, signalwise, of the "time window" produced by the monostable multivibrator MPZ for effecting the time comparison, is achieved.

All switching members of the control pulse generator and the quartz generator G itself, are actuated during a cycle and are thus checked as to their fault-free operation. Impermissible time deviations, as well as any other possible switching failures will become immediately noticeable, in an advantageous manner, by the fact that no further cycle is thereafter triggered. This fail-safe characteristic of the circuit thus achieves the additional advantage that, for example, no doubling of the series circuit in an effort to increase reliability is required.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. A control pulse generator for the fault-free cyclical generation of an accurate sequence of control pulses, comprising a quartz pulse generator operatively connected to a control circuit having a first pulse-edge controlled D-flipflop, the pulse input of which is connected to the output of the quartz generator, a first monostable multivibrator, to a first dynamic input of which the pulse output of said first D-flipflop is connected, said first monostable vibrator having an output connected to the pulse input of a second pulse-edge controlled D-flipflop, one output of said second D-flipflop being connected to the input of a first delay member of a plurality of serially connected delay members, a directly acting blocking input of said second D-flipflop being connected with said quartz pulse generator, a second monostable multivibrator which has its dynamic input connected with the output of the last delay member of said serially connected delay members, an output of the second monostable multivibrator being connected to a directly acting blocking input of said first pulse-edge controlled D-flipflop and to the D-input of said second pulse-edge controlled D-flipflop.

2. A control pulse generator according to claim 1, wherein each of therespective serially connected delay members comprises a monostable multivibrator, each of which has its output connected to the input of the following monostable multivibrator, with the output of the last of such serially connected multivibrators being connected to said dynamic input of the said second monostable multivibrator.

3. A control pulse generator according to claim 1, wherein the control circuit comprises in further combination, a third pulse-edge controlled D-flipflop having its pulse input connected to the quartz pulse generator and having a directly acting blocking input connectible over a push-button contact to a reset potential, for effecting a start operation, an output of the said third D-flipflop being connected to a second dynamic input of the said first monostable multivibrator.

4. A control pulse generator according to claim 3, wherein each of the respective serially connected delay members comprises a monostable multivibrator, each of which has its output connected to the input of the following monostable multivibrator, with the output of the last of such serially connected multivibrators being connected to said dynamic input of the said second monostable multivibrator.

* * * * *